United States Patent
Dube et al.

(10) Patent No.: US 10,199,215 B2
(45) Date of Patent: *Feb. 5, 2019

(54) APPARATUS AND METHOD FOR SELECTIVE DEPOSITION

(71) Applicant: Applied Materials, Inc., Santa Clara, CA (US)

(72) Inventors: Abhishek Dube, Fremont, CA (US); Schubert S. Chu, San Francisco, CA (US); Jessica S. Kachian, Sunnyvale, CA (US); David Thompson, San Jose, CA (US); Jeffrey Anthis, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/684,827

(22) Filed: Aug. 23, 2017

(65) Prior Publication Data

US 2017/0352531 A1    Dec. 7, 2017

Related U.S. Application Data

(62) Division of application No. 15/247,586, filed on Aug. 25, 2016, now Pat. No. 9,768,013.

(Continued)

(51) Int. Cl.
  *H01L 21/02* (2006.01)
  *H01J 37/32* (2006.01)
  (Continued)

(52) U.S. Cl.
  CPC ......... *H01L 21/0228* (2013.01); *C23C 16/04* (2013.01); *C23C 16/45544* (2013.01);
  (Continued)

(58) Field of Classification Search
  CPC ........... H01L 21/0228; H01L 21/02172; H01L 21/02049; H01L 21/283; C23C 16/45544;
  (Continued)

(56) References Cited

U.S. PATENT DOCUMENTS 5,378,309 A * 1/1995 Rabinzohn ........ H01L 21/32136
                                                        216/13
6,174,377 B1 * 1/2001 Doering ................. C23C 16/44
                                                        118/715

(Continued)

FOREIGN PATENT DOCUMENTS

WO    2014/053202 A1    4/2014

OTHER PUBLICATIONS

L. Huamao, et al., Chemical Surface Modification of SiO2 Electret by DCDMS, IEEE, 1996, 6 pages.

(Continued)

*Primary Examiner* — Jeffrie R Lund
(74) *Attorney, Agent, or Firm* — Patterson + Sheridan LLP

(57) ABSTRACT

Methods and apparatus for processing a substrate are described herein. Methods for passivating dielectric materials include forming alkyl silyl moieties on exposed surfaces of the dielectric materials. Suitable precursors for forming the alkyl silyl moieties include (trimethylsilyl) pyrrolidine, aminosilanes, and dichlorodimethylsilane, among others. A capping layer may be selectively deposited on source/drain materials after passivation of the dielectric materials. Apparatus for performing the methods described herein include a platform comprising a transfer chamber, a pre-clean chamber, an epitaxial deposition chamber, a passivation chamber, and an atomic layer deposition chamber.

13 Claims, 7 Drawing Sheets

Related U.S. Application Data

(60) Provisional application No. 62/221,949, filed on Sep. 22, 2015.

(51) Int. Cl.
  *C23C 16/04* (2006.01)
  *H01L 21/283* (2006.01)
  *C23C 16/455* (2006.01)
  *C23C 16/52* (2006.01)

(52) U.S. Cl.
  CPC ........ *C23C 16/52* (2013.01); *H01J 37/32009* (2013.01); *H01J 37/32357* (2013.01); *H01J 37/32522* (2013.01); *H01J 37/32899* (2013.01); *H01L 21/02049* (2013.01); *H01L 21/02172* (2013.01); *H01L 21/283* (2013.01); *H01J 2237/334* (2013.01)

(58) Field of Classification Search
  CPC .... C23C 16/04; C23C 16/52; H01J 37/32357; H01J 37/32009; H01J 37/32899; H01J 37/32522; H01J 2237/334
  See application file for complete search history.

(56) References Cited

U.S. PATENT DOCUMENTS

| | | | | |
|---|---|---|---|---|
| 6,287,990 | B1* | 9/2001 | Cheung | C23C 16/401 257/E21.279 |
| 6,350,830 | B1* | 2/2002 | Gores | C08F 10/00 502/153 |
| 9,209,279 | B1* | 12/2015 | Zhang | H01L 29/66795 |
| 9,543,148 | B1* | 1/2017 | Hudson | H01L 21/31116 |
| 9,768,013 | B2* | 9/2017 | Dube | H01L 21/0228 |
| 9,887,097 | B2* | 2/2018 | Hudson | H01L 21/31138 |
| 2002/0132389 | A1* | 9/2002 | Patel | B81B 7/0077 438/97 |
| 2003/0047533 | A1* | 3/2003 | Reid | B81C 1/00476 216/24 |
| 2003/0082307 | A1* | 5/2003 | Chung | C23C 16/34 427/402 |
| 2003/0213560 | A1* | 11/2003 | Wang | C23C 14/566 156/345.31 |
| 2005/0158884 | A1* | 7/2005 | Gaynor | H01L 21/31058 438/4 |
| 2005/0224181 | A1* | 10/2005 | Merry | H01J 37/32357 156/345.35 |
| 2006/0051966 | A1* | 3/2006 | Or | H01J 37/32082 438/706 |
| 2006/0130971 | A1* | 6/2006 | Chang | H01J 37/32082 156/345.48 |
| 2006/0162658 | A1* | 7/2006 | Weidman | C23C 16/06 118/715 |
| 2006/0165892 | A1* | 7/2006 | Weidman | C23C 16/06 427/248.1 |
| 2006/0219757 | A1* | 10/2006 | Rubinsztajn | C08G 59/42 228/101 |
| 2006/0223933 | A1* | 10/2006 | Rubinsztajn | C08K 3/011 524/492 |
| 2007/0202254 | A1* | 8/2007 | Ganguli | C23C 16/18 427/252 |
| 2007/0254112 | A1* | 11/2007 | Takehara | B08B 7/0035 427/569 |
| 2008/0026553 | A1* | 1/2008 | Chua | H01L 21/0217 438/591 |
| 2008/0032064 | A1 | 2/2008 | Gordon et al. | |
| 2008/0073736 | A1* | 3/2008 | Hwang | H01L 27/1462 257/432 |
| 2009/0045396 | A1* | 2/2009 | Hahn | G03F 7/0046 257/40 |
| 2010/0087052 | A1* | 4/2010 | Xu | H01J 37/321 438/530 |
| 2010/0120245 | A1* | 5/2010 | Tjandra | B32B 38/0008 438/660 |
| 2010/0330425 | A1* | 12/2010 | Lopatin | C25D 3/38 429/220 |
| 2011/0124192 | A1* | 5/2011 | Ganguli | C23C 16/18 438/653 |
| 2011/0151674 | A1* | 6/2011 | Tang | H01J 37/32357 438/715 |
| 2011/0266252 | A1* | 11/2011 | Thadani | H01J 37/32357 216/17 |
| 2011/0266256 | A1* | 11/2011 | Cruse | H01J 37/32899 216/59 |
| 2012/0103857 | A1* | 5/2012 | Behm | C23C 16/448 206/524.3 |
| 2012/0285621 | A1* | 11/2012 | Tan | H01J 37/32357 156/345.31 |
| 2013/0280918 | A1 | 10/2013 | Ahmed | |
| 2014/0170853 | A1* | 6/2014 | Shamma | H01L 21/02115 438/699 |
| 2015/0132898 | A1 | 5/2015 | Cheng et al. | |
| 2015/0228903 | A1 | 8/2015 | Backlund et al. | |
| 2016/0064260 | A1* | 3/2016 | Berry, III | H01L 21/67069 438/712 |
| 2016/0111258 | A1* | 4/2016 | Taskar | H01J 37/32449 156/345.24 |
| 2016/0135274 | A1* | 5/2016 | Fischer | H05G 2/003 438/9 |
| 2016/0163556 | A1* | 6/2016 | Briggs | H01L 21/30655 438/696 |
| 2016/0163557 | A1* | 6/2016 | Hudson | H01L 21/30655 438/696 |
| 2016/0163558 | A1* | 6/2016 | Hudson | H01L 21/30655 438/696 |
| 2016/0181117 | A1* | 6/2016 | Arghavani | H01L 21/31116 438/712 |
| 2016/0203995 | A1* | 7/2016 | Kanarik | H01L 21/0228 438/703 |
| 2016/0276148 | A1* | 9/2016 | Qian | H01J 37/32899 |
| 2016/0314985 | A1* | 10/2016 | Yang | H01J 37/32449 |
| 2016/0336178 | A1* | 11/2016 | Swaminathan | C23C 16/045 |
| 2016/0343580 | A1* | 11/2016 | Hudson | H01J 37/32513 |
| 2016/0343612 | A1* | 11/2016 | Wang | H01L 21/76862 |
| 2016/0358782 | A1* | 12/2016 | Yang | H01L 21/3065 |
| 2017/0053819 | A1* | 2/2017 | Richardson | H01L 21/67259 |
| 2017/0076955 | A1* | 3/2017 | Hudson | H01L 21/30655 |
| 2017/0084449 | A1* | 3/2017 | Dube | H01L 21/0228 |
| 2017/0178917 | A1* | 6/2017 | Kamp | H01L 21/3065 |
| 2017/0178920 | A1* | 6/2017 | Dole | H01J 37/32899 |
| 2017/0350038 | A1* | 12/2017 | Lo | C30B 25/186 |
| 2017/0352531 | A1* | 12/2017 | Dube | H01L 21/0228 |
| 2018/0076065 | A1* | 3/2018 | Bao | B08B 7/0035 |

OTHER PUBLICATIONS

International Search Report and Written Opinion of related application PCT/US2016/048238 dated Dec. 19, 2016.

\* cited by examiner

APPARATUS AND METHOD FOR SELECTIVE DEPOSITION

CROSS-REFERENCE TO RELATED APPLICATIONS

This application is a divisional of U.S. patent application Ser. No. 15/247,586, filed Aug. 25, 2016, which claims benefit of U.S. Provisional Patent Application No. 62/221,949, filed Sep. 22, 2015, each of which are herein incorporated by reference in their entirety.

BACKGROUND

Field

Embodiments of the present disclosure generally relate to apparatus and methods for performing selective deposition processes.

Description of the Related Art

Epitaxial deposition processes are commonly utilized techniques for depositing various semiconductor device structures. For example, the source and drain regions of a fin field effect transistor (FinFET) may be deposited via epitaxial processes. Epitaxial deposition is often utilized where a highly ordered crystalline structure is desirable. In addition, epitaxially deposited layers may also be doped to alter the electrical and compositional characteristics. As such, epitaxial deposition processes have gained widespread utilization in the semi-conductor arts.

However, epitaxial deposition processes are generally time consuming and have adverse effects on throughput in semiconductor manufacturing. In addition, various device processing schemes utilize post epitaxial deposition etching processes which remove the epitaxially deposited material, which may be undesirable. Current processing schemes often utilize a "loss budget" of the epitaxially deposited layer by depositing a greater amount of the epitaxial film than is often necessary to form a device to account for subsequent losses through etching. However, depositing additional amounts of an epitaxially deposited layer is time consuming and further reduces throughput.

Therefore, there is a need in the art for improved semiconductor processing methods and apparatus suitable for performing such methods.

SUMMARY

In one embodiment, a substrate processing apparatus is provided. The apparatus includes a processing platform and a transfer chamber centrally disposed on the processing platform. At least one substrate transfer robot may be disposed within the transfer chamber and a pre-clean chamber may be disposed on the processing platform adjacent the transfer chamber. An epitaxial deposition chamber may be disposed on the processing platform adjacent the transfer chamber and a surface passivation chamber may be disposed on the processing platform adjacent the transfer chamber. Additionally, an atomic layer deposition chamber may be disposed on the processing platform adjacent the transfer chamber.

In another embodiment, a substrate processing method is provided. The method includes delivering a substrate to a first processing chamber disposed on a platform and performing a pre-clean process on the substrate. The substrate may be transferred from the first processing chamber to a second processing chamber disposed on the platform without breaking vacuum. An epitaxial deposition process may be performed to deposit source/drain materials on the substrate in the second processing chamber and the substrate may be transferred from the second processing chamber to a third processing chamber disposed on the platform without breaking vacuum. A surface passivation process may be performed to modify surfaces of dielectric materials disposed on the substrate and the substrate may be transferred from the third processing chamber to a fourth processing chamber disposed on the platform without breaking vacuum. A capping layer may also be deposited on the source/drain materials.

In yet another embodiment, a surface passivation method is provided. The method includes exposing a substrate comprising silicon containing device features and dielectric materials to a pre-cleaning process to remove native oxide materials from surfaces of the silicon containing device features. Source/drain materials may be epitaxially deposited on the silicon containing device features and exposed surfaces of the dielectric materials may be passivated by depositing alkyl silyl materials on the dielectric materials. A capping layer may also be deposited on the source drain materials.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus for processing a substrate are described herein. Methods for passivating dielectric materials include forming alkyl silyl moieties on exposed surfaces of the dielectric materials. Suitable precursors for forming the alkyl silyl moieties include (trimethylsilyl) pyrrolidine, aminosilanes such as aminosilane and diaminosilane, and dichlorodimethylsilane, among others. A capping layer may be selectively deposited on source/drain materials after passivation of the dielectric materials. Apparatus for performing the methods described herein include a platform comprising a transfer chamber, a pre-clean chamber, an epitaxial deposition chamber, a passivation chamber, and an atomic layer deposition chamber.

Figure 1:
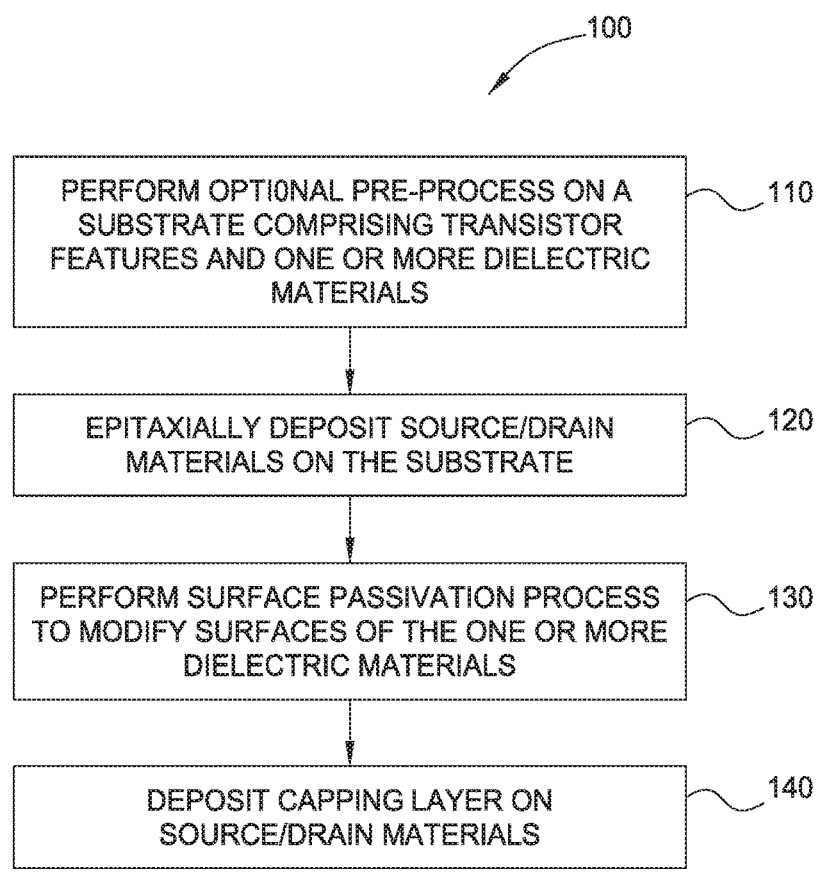
FIG. 1 illustrates operations of a method for performing a passivation process according to embodiments described herein.

FIG. 1 illustrates operations of a method 100 for performing a passivation process according to embodiments described herein. Generally, the method 100 may be utilized to improve deposition selectivity of subsequently deposited materials. Although the examples described herein are made with reference to surface modification and passivation of dielectric materials, it is contemplated that other materials and suitable passivation chemistries may benefit from the embodiments described herein. Moreover, reference is generally made to selective deposition on epitaxially deposited materials, however, other deposition methods, such as chemical vapor deposition, atomic layer deposition, physical vapor deposition, and derivatives thereof, may also benefit from the embodiments described herein.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The substrate itself is not limited to any particular size or shape. Although the embodiments described herein are made with generally made with reference to a round 200 mm or 300 mm substrate, other shapes, such as polygonal, squared, rectangular, curved, or otherwise non-circular workpieces may be utilized according to the embodiments described herein.

Figure 2:
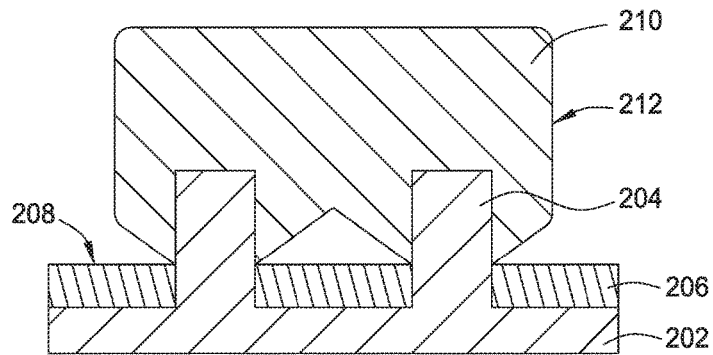
FIG. 2 schematically illustrates a partial, cross-sectional view of a substrate including device features and source/drain materials according to embodiments described herein.
Figure 3:
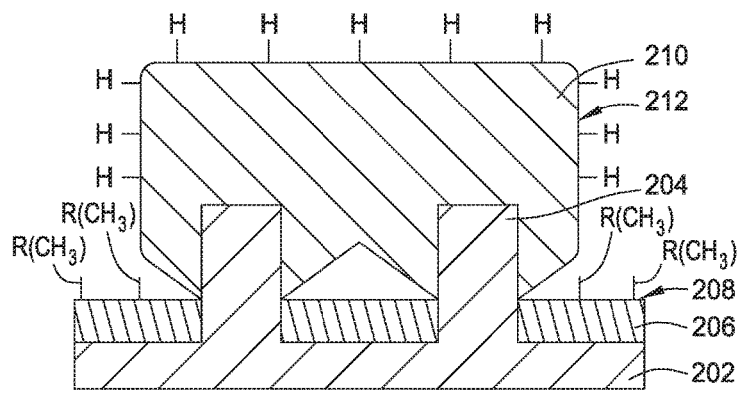
FIG. 3 illustrates the substrate of FIG. 2 after a dielectric passivation process has been performed according to embodiments described herein.
Figure 4:
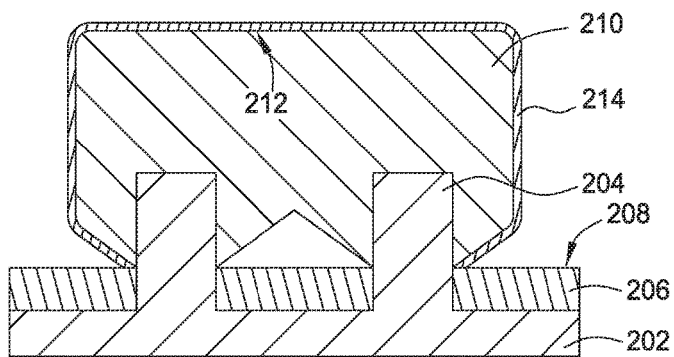
FIG. 4 illustrates the substrate of FIG. 3 after selectively depositing a capping layer on the source/drain materials.

For purposes of illustration, FIG. 2, FIG. 3, and FIG. 4 will be discussed in parallel with FIG. 1. At operation 100, a pre-clean process may be performed on a substrate comprising transistor features and one or more dielectric materials. More generally, the transistor features may be device features, such as fin field effects transistors (FinFETs), and the dielectric materials may be shallow trench isolation materials, such as oxide or nitride materials.

The pre-clean process may be performed to remove native oxide materials disposed on the transistor features. For example, if the transistor features are a silicon containing material, silicon dioxide may be present on the transistor features if, during the processing sequence, the transistor features are exposed to an ambient environment containing oxygen. While native oxides may be very thin layers of material, such as between about 5 Å and about 20 Å, the oxides may cause difficulties in subsequent fabrication processes. In one embodiment, the pre-clean process may be a SICONI® pre-clean process, available from Applied Materials, Inc., Santa Clara, Calif. Generally, the pre-clean process includes exposing substrate surfaces to a mixture of ammonia ($NH_3$) and nitrogen trifluoride ($NF_3$). The pre-clean process is generally a dry-etching process utilized to selectively remove native oxide materials from the substrate surfaces.

During the pre-clean process, the substrate may be maintained at a temperature of below about 100° C. and the ammonia and nitrogen trifluoride gas mixture may be exposed to the substrate surfaces. The ammonia and nitrogen trifluoride may be provided in a mixture having at least a 1:1 molar ratio (ammonia:nitrogen trifluoride). In one embodiment, the ratio of ammonia to nitrogen trifluoride may be between about 5:1 and about 30:1. A purge gas or carrier gas may also be added to the cleaning gas mixture. Suitable purge/carrier gases include argon, helium, hydrogen, nitrogen, or mixtures thereof. Generally, the gas mixture is from about 0.05% to about 20% by volume of ammonia and nitrogen trifluoride. The remainder of the gas mixture may be the purge/carrier gas. The pressure maintained during the pre-clean process may be between about 500 mTorr and about 30 Torr. An RF power of between about 5 W and about 600 W may be utilized to form a plasma of the gas mixture. The frequency of the RF power may be less than 100 kHz, such as between about 50 kHz and about 90 kHz. An exemplary processing chamber which may be utilized to perform the pre-clean process is described in greater detail with regard to FIG. 8.

The plasma energy dissociates the ammonia and nitrogen trifluoride gases into reactive species that combine to form a highly reactive ammonium fluoride ($NH_4F$) and/or ammonium hydrogen fluoride ($NH_4$—$HF_2$) in the gas phase. It is believed that the etchant gas, $NH_4F$ and/or $NH_4$—$HF_2$, reacts with the silicon oxide surface to form ammonium hexafluorosilicate, ammonia, and water as products. The ammonia and water may be in the vapor phase at processing conditions and may be evacuated from the processing region. The ammonium hexafluorisilicate may be volatilized by heat in the processing region into $SiF_4$, ammonia, and HF products, which are then removed from the processing region. Accordingly, native oxides on the substrate surfaces may be removed to prepare the substrate for subsequent processing operations.

In one embodiment, the pre-clean process may also be a hydrogen plasma process. The hydrogen plasma may also react to remove native oxide materials from surfaces of the substrate. Alternatively, the pre-clean process may be optional. In this embodiment, if the substrate is not exposed to oxygen in an atmospheric environment, the pre-clean process may not be utilized.

At operation 120, source/drain materials may be epitaxially deposited on the substrate. FIG. 2 schematically illustrates a partial, cross-sectional view of a substrate 202 including device features 204, dielectric materials 206, and source/drain materials 210 according to embodiments described herein. Generally, the device features 204 may be manufactured from a silicon containing material, such as pure silicon, doped silicon, silicon germanium and the like. The dielectric materials 206 are generally formed from oxide or nitride materials, such as $SiO_2$ and/or $Si_3N_4$.

The source/drain materials 210 may be one or more of silicon materials, silicon germanium materials, silicon phosphorous materials, and carbon containing materials. In one embodiment, the source/drain materials 210 may be grown on the device features 204. In one embodiment, the device features 204 may have a <100> crystallographic orientation. In other embodiments, the device features 204 may have a <111> or <101> crystallographic orientation, depending on the types of materials and the formation process utilized to manufacture the device features 204. In one embodiment, the source/drain materials 210 may be deposited utilizing a reduced pressure (RP) Epi chamber available from Applied Materials, Inc., Santa Clara, Calif. However, it is contemplated that other suitably configured chambers from other manufacturers may also be implemented to perform the source/drain materials deposition process.

Subsequent to the source/drain materials deposition, a surface preparation process may be performed. The surface preparation process may prepare exposed surfaces 208 of the dielectric materials 206 and exposed surfaces 212 of the source/drain materials 210 for subsequent processing operations. In one embodiment, the surface preparation process includes a pre-clean comprising exposing the dielectric materials 206 and the source/drain materials to dilute hydrogen fluoride (HF). In one embodiment, the exposed surfaces 208, 212 may be treated with 100:1 HF at room temperature for about 90 seconds. Other dilute HF concentrations, temperatures, and exposure times may be utilized depending on the degree of surface cleaning desired. After the dilute HF pre-clean process, the exposed surfaces 208 may be ionized. In one embodiment, if the dielectric materials 206 comprise $SiO_2$, the exposed surfaces 208 may be —OH terminated. In another embodiment, if the dielectric materials 206 comprise $Si_3N_4$, the exposed surfaces 208 may be —$NH_2$ terminated. Generally, the exposed surfaces 212 of the source/drain materials 210 may be —H terminated after exposure to the dilute HF pre-clean. In an alternative embodiment, an HF plasma may be used in place of the dilute HF pre-clean to prepare the exposed surfaces 208 for subsequent passivation.

At operation 130, a surface passivation process may be performed to modify the exposed surface 208 of the dielectric materials 206. Generally, upon passivation, described in greater detail below, the exposed surfaces 208 of the dielectric materials may be selectively methylated. As a result of the passivation chemistry utilized, the —H terminated surface of the source drain materials 210 may remain unmodified during the passivation process.

Reference is now made to FIGS. 5A-B and FIGS. 6A-B regarding mechanisms for modifying the exposed surface 208 of the dielectric materials 206. Suitable apparatus for performing the passivation processes described below may be had with reference to FIG. 9. While the embodiments described below are made with reference to silicon dioxide materials and silicon nitride materials, it is contemplated that similar advantages may be realized in the passivation of SiOCN dielectric materials.

Figure 5A:
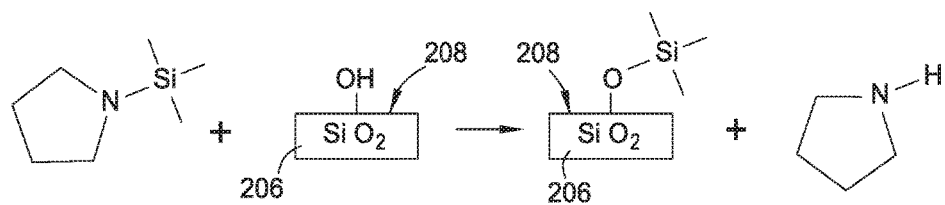
FIG. 5A schematically illustrates passivation of a silicon dioxide material with a first precursor according to embodiments described herein.

FIG. 5A schematically illustrates the passivation mechanism of a silicon dioxide material. In one embodiment, the silicon dioxide material may be the dielectric material 206. In this embodiment, the exposed surfaces 208 of the dielectric material 206 are —OH terminated. A silyl amine precursor, such as 1(trimethylsilyl) pyrrolidine, or an aminosilane as mentioned above, may be reacted with the —OH terminated dielectric material 206. In certain embodiments, the precursors may be reacted together with the —OH terminated surface or sequentially with the —OH terminated surface. In one embodiment, the precursor may be thermally dissociated at a temperature of less than about 500° C., such as less than about 400° C. The passivation process may be performed at a pressure of between about 3 Torr and about 30 Torr for a time of between about 5 seconds and about 50 seconds, for example, between about 10 second and about 30 seconds, for example, about 20 seconds. The processing conditions may facilitate alkyl silyl termination of the exposed surface 208. Additional reaction products, such as pyrrolidine and ammonia, may be evacuated from the processing volume.

Figure 5B:
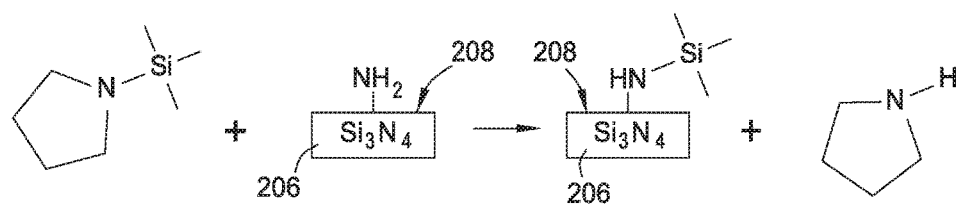
FIG. 5B schematically illustrates passivation of a silicon nitride material with the first precursor according to embodiments described herein.

FIG. 5B schematically illustrates the passivation mechanism of a silicon nitride material. In one embodiment, the silicon nitride material may be the dielectric material 206. In this embodiment, the exposed surfaces 208 of the dielectric material 206 are —$NH_2$ terminated. A silyl amine precursor, such as 1(trimethylsilyl)pyrrolidine, or an aminosilane as mentioned above, may be reacted with the —$NH_2$ terminated dielectric material 206. In certain embodiments, the precursors may be reacted together with the —$NH_2$ terminated surface or sequentially with the $NH_2$ terminated surface. In one embodiment, the precursor may be thermally dissociated at a temperature of less than about 500° C., such as less than about 400° C. The passivation process may be performed at a pressure of between about 3 Torr and about 30 Torr for a time of between about 5 seconds and about 50 seconds, for example, between about 10 second and about 30 seconds, for example, about 20 seconds. The processing conditions may facilitate alkyl silyl termination of the exposed surface 208. Additional reaction products, such as pyrrolidine and ammonia, may be evacuated from the processing volume.

Figure 6A:
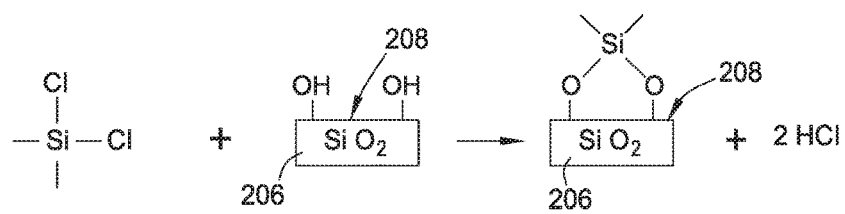
FIG. 6A schematically illustrates passivation of a silicon dioxide material with a second precursor according to embodiments described herein.

FIG. 6A schematically illustrates the passivation mechanism of a silicon oxide material. In one embodiment, the silicon oxide material may be the dielectric material 206. In this embodiment, the exposed surfaces 208 of the dielectric material 206 are —OH terminated. A chlorosilane precursor, such as dichlorodimethylsilane (DCDMS), may be reacted with the —OH terminated dielectric material 206. In one embodiment, the precursor may be thermally dissociated at a temperature of less than about 500° C., such as between about room temperature (i.e. approximately 20° C.) and about 400° C. The passivation process may be performed at a pressure of between about 3 Torr and about 30 Torr for a time of between about 5 seconds and about 50 seconds, for example, between about 10 second and about 30 seconds, for example, about 20 seconds. The processing conditions may facilitate alkyl silyl termination of the exposed surface 208. Additional reaction products, such as HCl, may be evacuated from the processing volume.

Figure 6B:
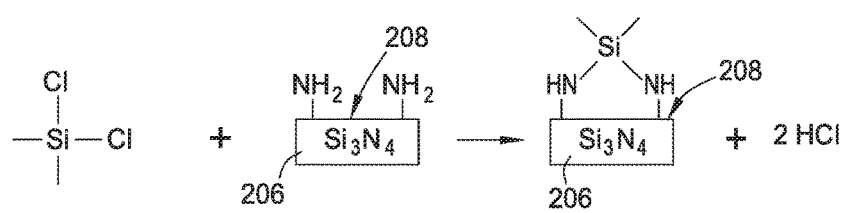
FIG. 6B schematically illustrates passivation of a silicon nitride material with the second precursor according to embodiments described herein.

FIG. 6B schematically illustrates the passivation mechanism of a silicon nitride material. In one embodiment, the silicon nitride material may be the dielectric material 206. In this embodiment, the exposed surfaces 208 of the dielectric material 206 are —$NH_2$ terminated. A chlorosilane precursor, such as dichlorodimethylsilane (DCDMS), may be reacted with the —$NH_2$ terminated dielectric material 206. In one embodiment, the precursor may be thermally dissociated at a temperature of less than about 500° C., such as between about room temperature (i.e. approximately 20° C.) and about 400° C. The passivation process may be performed at a pressure of between about 3 Torr and about 30 Torr for a time of between about 5 seconds and about 50 seconds, for example, between about 10 second and about 30 seconds, for example, about 20 seconds. The processing conditions may facilitate alkyl silyl termination of the exposed surface 208. Additional reaction products, such as HCl, may be evacuated from the processing volume.

In each of the embodiments described with regard to FIGS. 5A-B and 6A-B, it is contemplated that —H terminated exposed surfaces 212 of the source/drain materials 210 may be substantially non-reactive with the precursors utilized to passivate the dielectric materials 206. As a result of the surface passivation of the dielectric materials 206, the exposed surfaces 208 may exhibit generally hydrophobic characteristics which may inhibit or substantially reduce epitaxial or atomic layer growth on the exposed surfaces 208. Generally, as described in greater detail above, the silylamine, chlorosilane, and aminosilane precursors may be utilized alone, in combination, and/or sequentially to passivate the dielectric materials 206.

Referring back to FIG. 1, at operation 140, a capping layer 214 may be deposited on the source drain materials 210. As illustrated in FIG. 4, the capping layer 214 is selectively deposited on the surface 212 of the source/drain materials 210. Generally, the capping layer 214 may be deposited to a thickness of between about 1 nm and about 10 nm. In one embodiment, the capping layer 214 may be deposited by an atomic layer deposition (ALD) process. A suitable processing chamber for performing the capping layer deposition process include ALD chambers available from Applied Materials, Inc., Santa Clara, Calif. However, it is contemplated that other suitably configured ALD chambers from other manufacturers may also be utilized according to the embodiments described herein.

Suitable materials for the capping layer 214 include metal oxide materials, such as aluminum oxide, hafnium oxide, zirconium oxide, manganese oxide, among others. Various ceramic materials, such as silicon nitride or the like, may also be utilized for the capping layer 214. Generally, the capping layer deposition process will selectively deposit the capping layer 214 on the source/drain materials 210 due to the passivation of the exposed surfaces 208 of the dielectric materials 206. After deposition of the capping layer 214, the passivation layer formed on the dielectric materials 206 may be removed to prepare the dielectric materials 206 for subsequent processing operations.

Figure 7:
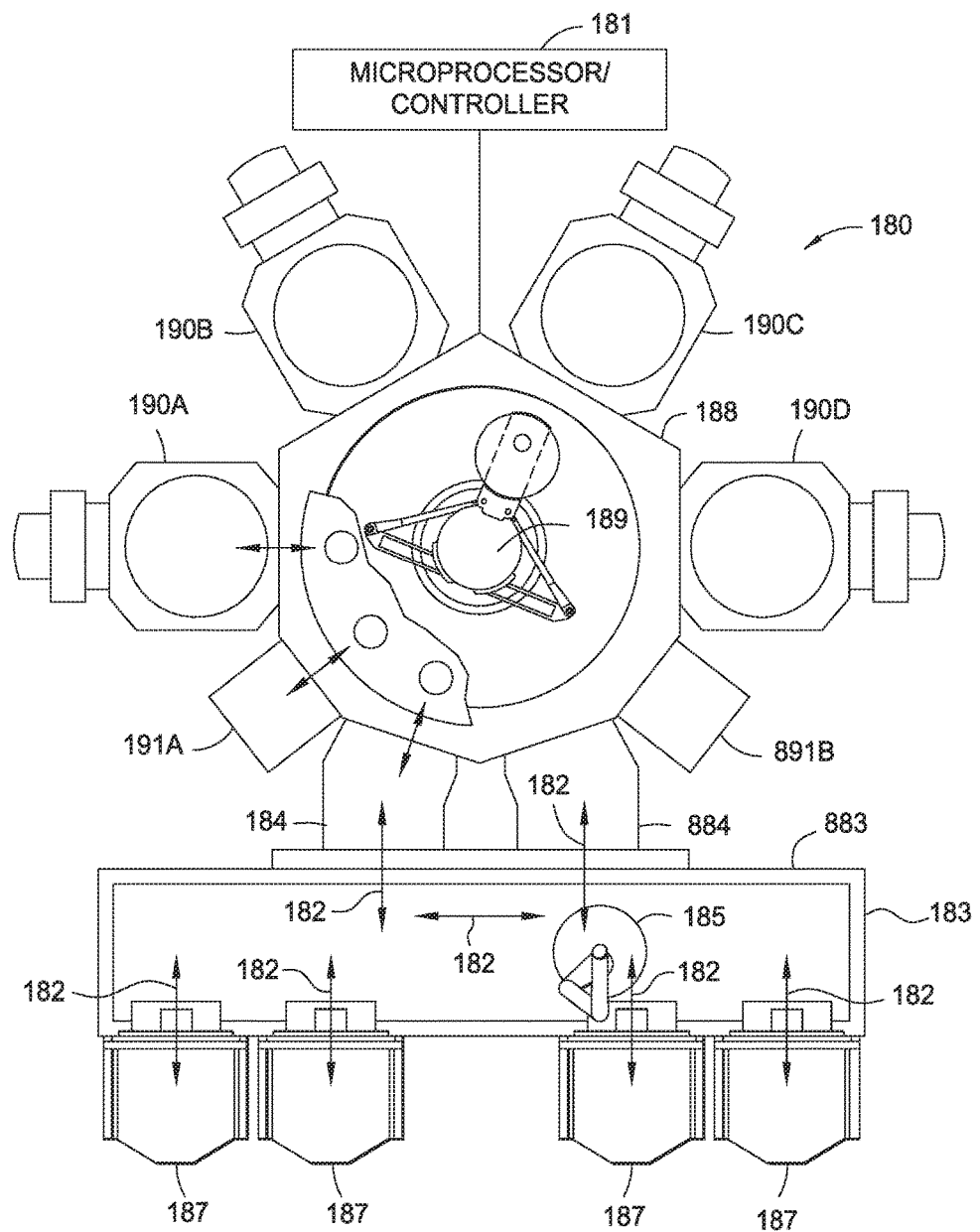
FIG. 7 illustrates a plan view of a processing platform according to embodiments described herein.

FIG. 7 illustrates a plan view of a processing platform 180 according to embodiments described herein. The processing platform 180 (also known as a cluster tool) is intended to be representative of an apparatus suitable for performing the methods described herein. One example of the processing platform 180 is the Centura® platform, available from Applied Materials, Inc., of Santa Clara, Calif. Generally, a processing platform is a modular system comprising multiple chambers which perform various functions including substrate center-finding and orientation, degassing, annealing, deposition and/or etching.

According to embodiments of the present disclosure, a processing platform includes a pre-clean chamber, an epitaxial deposition chamber, a surface passivation chamber, and a vapor deposition chamber. The multiple chambers of the processing platform 180 are mounted to a central transfer chamber 188 which houses a robot 189 adapted to shuttle substrates between the chambers. The transfer chamber 188 is typically maintained at a vacuum condition and provides an intermediate stage for shuttling substrates from one chamber to another and/or to load lock chambers 184 positioned at a front end of the processing platform 180.

As described above, the processing platform 180 generally comprises a plurality of chambers 190A-D and robots 185, 189 and may also be equipped with a microprocessor controller 181 programmed to carry out the various processing methods described herein. A front-end environment 183 is shown positioned in selective communication with a pair of load lock chambers 184. A pod loader 185 disposed in the front-end environment 183 is capable of linear and rotational movement (arrows 182) to shuttle cassettes of substrates between the load locks 184 and a plurality of pods 187 which are mounted on the front-end environment 183. The load locks 184 provide a first vacuum interface between the front-end environment 183 and a transfer chamber 188. Two load locks 184 are provided to increase throughput by alternatively communicating with the transfer chamber 188 and the front-end environment 183. Thus, while one load lock 184 communicates with the transfer chamber 188, a second load lock 184 communicates with the front-end environment 183.

A robot 189 is centrally disposed in the transfer chamber 188 to transfer substrates from the load locks 184 to one of the various processing chambers 190A-D and service chambers 191A-B. The processing chambers 190A-D may perform any number of processes such as pre-cleaning processes, deposition processes, and surface modification processes, while the service chambers 191A-B are adapted for degassing, orientation, cooldown and the like.

In one embodiment, a first processing chamber 190A is configured as a pre-clean chamber. The first processing chamber 190A may be adapted to carry out a SICONI® pre-clean process. Alternatively, the first processing chamber 190A may be configured to perform a hydrogen plasma cleaning process. Embodiments of the first processing chamber 190A are described in greater detail with regard to FIG. 8.

A second processing chamber 190B may be an epitaxial deposition chamber adapted to epitaxially deposit one or more materials on a substrate. In one embodiment, the second processing chamber 190B may be configured to deposit source/drain materials on the substrate. One example of the second processing chamber 190B is the RP (reduced pressure) Epi chamber available from Applied Materials, Inc., of Santa Clara, Calif.

A third processing chamber 190C may be a surface passivation chamber adapted to modify exposed surface of dielectric materials disposed on the substrate. In addition, the third processing chamber 190C may be configured to perform any variety of etching and/or cleaning processes. For example, the third processing chamber 190C may be adapted to perform an HF dip and rinse (i.e. a dilute HF pre-clean process). In another embodiment, the third processing chamber 190C is a plasma chamber adapted to perform a hydrogen plasma surface modification process. Embodiments of the third processing chamber 190C are described in greater detail with regard to FIG. 9.

A fourth processing chamber 190D may be an vapor deposition chamber adapted to deposit a capping layer on epitaxial materials formed on the substrate, such as the source/drain materials deposited by the second processing chamber 190B. In one embodiment, the fourth processing chamber 190D may be a chemical vapor deposition (CVD) chamber. In another embodiment, the fourth processing chamber 190D may be an ALD chamber. A suitable ALD chamber is available from Applied Materials, Inc., of Santa Clara, Calif.

Figure 8:
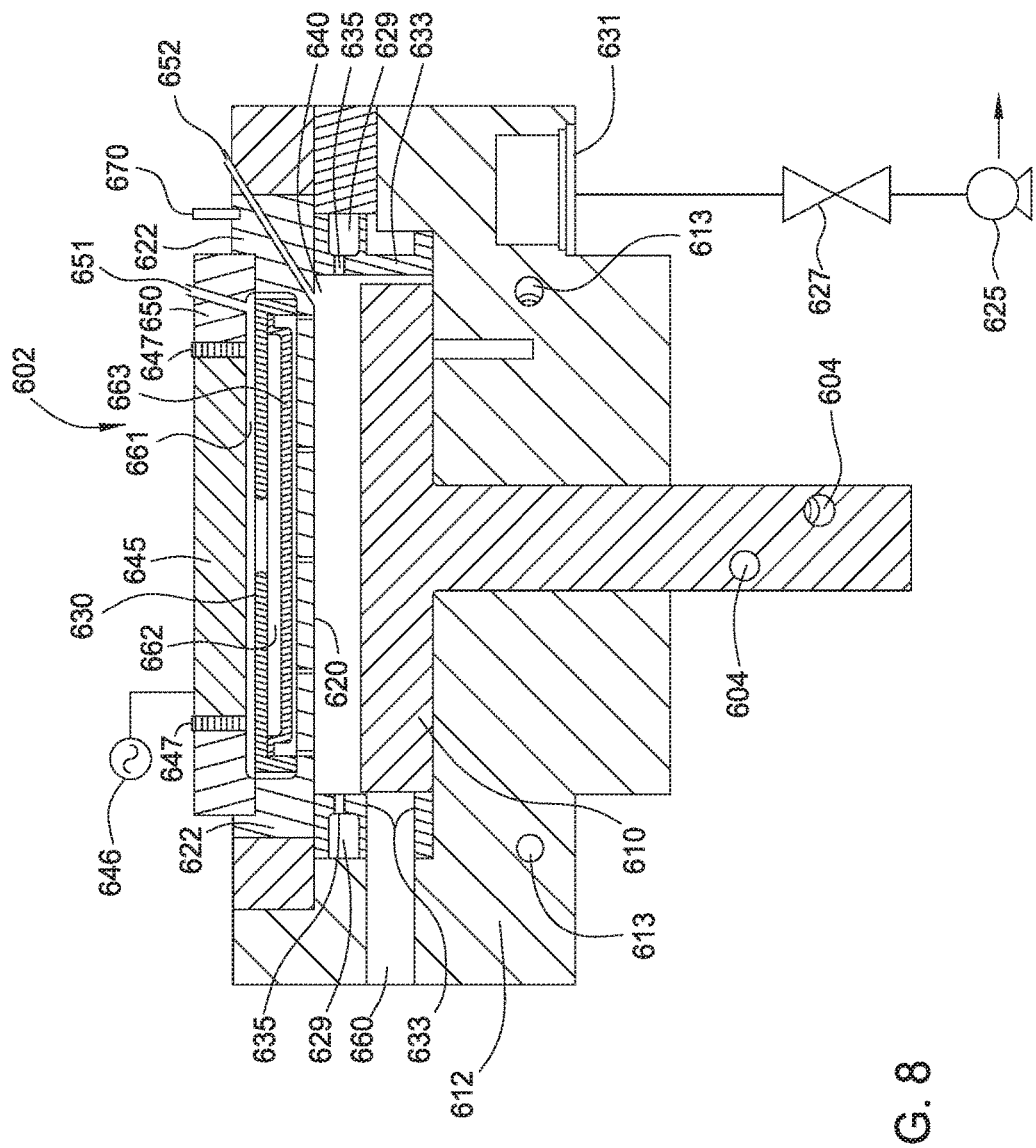
FIG. 8 illustrates a cross-sectional view of a pre-clean chamber according to embodiments described herein.

FIG. 8 illustrates is a cross sectional view showing an illustrative processing chamber 600, in which embodiments of the disclosure may be carried out. In one embodiment, the processing chamber 600 may be the first processing chamber 190A. Generally, a hydrogen-containing precursor and a fluorine-containing precursor may be introduced through one or more apertures 651 into remote plasma region(s) 661-663 and excited by plasma power source 646.

In one embodiment, the processing chamber 600 includes a chamber body 612, a lid assembly 602, and a support assembly 610. The lid assembly 602 is disposed at an upper end of the chamber body 612, and the support assembly 610 is at least partially disposed within the chamber body 612. The processing chamber 600 and the associated hardware are preferably formed from one or more process-compatible materials (e.g. aluminum, stainless steel, etc.).

The chamber body 612 includes a slit valve opening 660 formed in a sidewall thereof to provide access to the interior of the processing chamber 600. The slit valve opening 660 is selectively opened and closed to allow access to the interior of the chamber body 612 by a wafer handling robot (not shown). In one embodiment, a substrate can be transported in and out of the processing chamber 600 through the slit valve opening 660 to an adjacent transfer chamber (i.e. transfer chamber 189) and/or load-lock chamber (i.e. load-locks 184), or another chamber within the processing platform 180. An exemplary processing platform which may include the processing chamber 600 is shown in FIG. 7.

In one or more embodiments, chamber body 612 includes a chamber body channel 613 for flowing a heat transfer fluid through chamber body 612. The heat transfer fluid can be a heating fluid or a coolant and is used to control the temperature of chamber body 612 during processing and substrate transfer. Heating the chamber body 612 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 610 may have a support assembly channel 604 for flowing a heat transfer fluid through support assembly 610 thereby affecting the substrate temperature.

The chamber body 612 can further include a liner 633 that surrounds the support assembly 610. The liner 633 is preferably removable for servicing and cleaning. The liner 633 can be made of a metal such as aluminum, or a ceramic material. However, the liner 633 can be any process compatible material. The liner 633 can be bead blasted to increase the adhesion of any material deposited thereon, thereby preventing flaking of material which results in contamination of the processing chamber 600. In one or more embodiments, the liner 633 includes one or more apertures 635 and a pumping channel 629 formed therein that is in fluid communication with a vacuum system. The apertures 635 provide a flow path for gases into the pumping channel 629, which provides an egress for the gases within the processing chamber 600.

The vacuum system can include a vacuum pump 625 and a throttle valve 627 to regulate flow of gases through the processing chamber 600. The vacuum pump 625 is coupled to a vacuum port 631 disposed on the chamber body 612 and therefore, in fluid communication with the pumping channel 629 formed within the liner 633. The terms "gas" and "gases" are used interchangeably, unless otherwise noted, and refer to one or more reactants, catalysts, carrier, purge, cleaning, combinations thereof, as well as any other fluid introduced into the chamber body 612. The term "precursor" is used to refer to any process gas which takes part in a reaction to either remove or deposit material from a surface.

Apertures 635 allow the pumping channel 629 to be in fluid communication with a processing region 640 within the chamber body 612. The processing region 640 is defined by a lower surface of the lid assembly 602 and an upper surface of the support assembly 610, and is surrounded by the liner 633. The apertures 635 may be uniformly sized and evenly spaced about the liner 633. However, any number, position, size or shape of apertures may be used, and each of those design parameters can vary depending on the desired flow pattern of gas across the substrate receiving surface as is discussed in more detail below. In addition, the size, number and position of the apertures 635 are configured to achieve uniform flow of gases exiting the processing chamber 600. Further, the aperture size and location may be configured to provide rapid or high capacity pumping to facilitate a rapid exhaust of gas from the chamber 600. For example, the number and size of apertures 635 in close proximity to the vacuum port 631 may be smaller than the size of apertures 635 positioned farther away from the vacuum port 631.

A gas supply panel (not shown) is typically used to provide process gas(es) to the processing chamber 600 through one or more apertures 651. The particular gas or gases that are used depend upon the process or processes to be performed within the chamber 600. Illustrative gases can include, but are not limited to one or more precursors, reductants, catalysts, carriers, purge, cleaning, or any mixture or combination thereof. Typically, the one or more gases introduced to the processing chamber 600 flow into plasma volume 661 through aperture(s) 651 in top plate 650. Alternatively or in combination, processing gases may be introduced more directly through aperture(s) 652 into processing region 640. Aperture(s) 652 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 600. Depending on the process, any number of gases can be delivered to the processing chamber 600, and can be mixed either in the processing chamber 600 or before the gases are delivered to the processing chamber 600.

The lid assembly 602 can further include an electrode 645 to generate a plasma of reactive species within the lid assembly 602. In one embodiment, the electrode 645 is supported by top plate 650 and is electrically isolated therefrom by inserting electrically isolating ring(s) 647 made from aluminum oxide or any other insulating and process compatible material. In one or more embodiments, the electrode 645 is coupled to a power source 646 while the rest of lid assembly 602 is connected to ground. Accordingly, a plasma of one or more process gases can be generated in remote plasma region composed of volumes 661, 662 and/or 663 between electrode 645 and annular mounting flange 622. In embodiments, annular mounting flange comprises or supports gas delivery plate 620. For example, the plasma may be initiated and maintained between electrode 645 and one or both blocker plates of blocker assembly 630. Alternatively, the plasma can be struck and contained between the electrode 645 and gas delivery plate 620, in the absence of blocker assembly 630. In either embodiment, the plasma is well confined or contained within the lid assembly 602. Accordingly, the plasma is a "remote plasma" since no active plasma is in direct contact with the substrate disposed within the chamber body 612. As a result, plasma damage to the substrate may be avoided since the plasma is separated from the substrate surface.

A wide variety of power sources 646 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 600. In one embodiment, an RF power supply is coupled to electrode 645. A higher-power microwave power source 646 may be beneficial in the event that reactive oxygen will also be produced using power source 646.

The temperatures of the process chamber body 612 and the substrate may each be controlled by flowing a heat transfer medium through chamber body channel 613 and support assembly channel 604, respectively. Support assembly channel 604 may be formed within support assembly 610 to facilitate the transfer of thermal energy. Chamber body 612 and support assembly 610 may be cooled or heated independently. For example, a heating fluid may be provided through one while a cooling fluid is provided through the other.

Other methods may be used to control the substrate temperature. The substrate may be heated by heating the support assembly 610 (or a portion thereof, such as a pedestal) with a resistive heater or other suitable apparatus. In another configuration, gas delivery plate 620 may be maintained at a temperature higher than the substrate and the substrate can be elevated in order to raise the substrate temperature. In this case, the substrate is heated radiatively or by using a gas to conduct heat from gas delivery plate 620 to the substrate. The substrate may be elevated by raising support assembly 610 or by employing lift pins.

During the etch (i.e. pre-clean) processes described herein, chamber body 612 may be maintained within an approximate temperature range of between about 50° C. and about 80° C., between about 55° C. and about 75° C. or between about 60° C. and about 70° C. in different embodiments. During exposure to plasma effluents and/or oxidizing agents, the substrate may be maintained below about 100° C., below about 65° C., between about 15° C. and about 50° C., or between about 22° C. and about 40° C. in different embodiments. The substrate may also be held at elevated temperatures during the etch to further decrease the size of solid by-product grains. During the SICONI® etch, the substrate may be maintained between about 40° C. and about 90° C., between about 50° C. and about 85° C., or between about 60° C. and about 80° C. in different embodiments.

Plasma effluents include a variety of molecules, molecular fragments and ionized species. Currently entertained theoretical mechanisms of the SICONI® process are thought to include $NH_4F$ and $NH_4F \cdot HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from processing region 640 by vacuum pump 625. A thin discontinuous layer of $(NH_4)_2SiF_6$ solid by-products is left behind on the substrate surface.

Following exposure to plasma effluents and the associated accumulation of solid by-products, the substrate may be heated to remove the by-products. In embodiments, the gas delivery plate 620 is heatable by incorporating heating element 670 within or near gas delivery plate 620. The substrate may be heated by reducing the distance between the substrate and the heated gas delivery plate. The gas delivery plate 620 may be heated to between about 100° C. and about 150° C., between about 110° C. and about 140° C. or between about 120° C. and about 130° C. in different embodiments. By reducing the separation between the substrate and the heated gas delivery plate, the substrate may be heated to above about 75° C., above about 90° C., above about 100° C. or between about 115° C. and about 150° C. in different embodiments. The heat radiated from gas delivery plate 620 to the substrate may be sufficient to dissociate or sublimate solid $(NH_4)_2SiF_6$ on the substrate into volatile $SiF_4$, $NH_3$ and HF products which may be pumped away from processing region 640.

During a hydrogen-starved etch process, nitrogen trifluoride (or another fluorine-containing precursor) may be flowed into remote plasma volume 661 at rates between about 25 sccm and about 200 sccm, between about 50 sccm and about 150 sccm or between about 75 sccm and about 125 sccm in different embodiments. Ammonia (or hydrogen-containing precursors in general) may be flowed into remote plasma volume 661 at rates below or about 200 sccm, below or about 150 sccm, below or about 100 sccm, below or about 75 sccm, below or about 50 sccm or below or about 25 sccm in different embodiments.

During a fluorine-starved etch process, ammonia (or hydrogen-containing precursors in general) may be flowed into remote plasma volume 661 at rates between about 50 sccm and about 300 sccm, between about 75 sccm and about 250 sccm, between about 100 sccm and about 200 sccm or between about 120 sccm and about 170 sccm in different embodiments. Nitrogen trifluoride (or fluorine-containing precursors in general) may be flowed into remote plasma volume 661 at rates below or about 100 sccm, below or about 75 sccm, below or about 50 sccm, below or about 25 sccm or below or about 15 sccm in different embodiments.

As described above with regard to FIG. 1, flow rates of hydrogen-containing and fluorine-containing precursors into the remote plasma region may account for 0.05% to about 20% by volume of the overall gas mixture; the remainder being a carrier gas. In one embodiment, a purge or carrier gas is first initiated into the remote plasma region before those of the reactive gases to stabilize the pressure within the remote plasma region.

Production of the plasma effluents occurs within volumes 661, 662 and/or 663 by applying plasma power to electrode 645 relative to the rest of lid assembly 602. Plasma power can be a variety of frequencies or a combination of multiple frequencies. In the exemplary processing system the plasma is provided by RF power delivered to electrode 645. The RF power may be between about 1 W and about 1000 W, between about 5 W and about 600 W, between about 10 W and about 300 W or between about 20 W and about 100 W in different embodiments. The RF frequency applied in the exemplary processing system may be less than about 200 kHz, less than about 150 kHz, less than about 120 kHz or between about 50 kHz and about 90 kHz in different embodiments.

Processing region 640 can be maintained at a variety of pressures during the flow of ozone, oxygen, carrier gases and/or plasma effluents into processing region 640. The pressure may be maintained between about 500 mTorr and about 30 Torr, between about 1 Torr and about 10 Torr or between about 3 Torr and about 6 Torr in different embodiments. Lower pressures may also be used within processing region 640. The pressure may be maintained below or about 500 mTorr, below or about 250 mTorr, below or about 100 mTorr, below or about 50 mTorr or below or about 20 mTorr in different embodiments.

Figure 9:
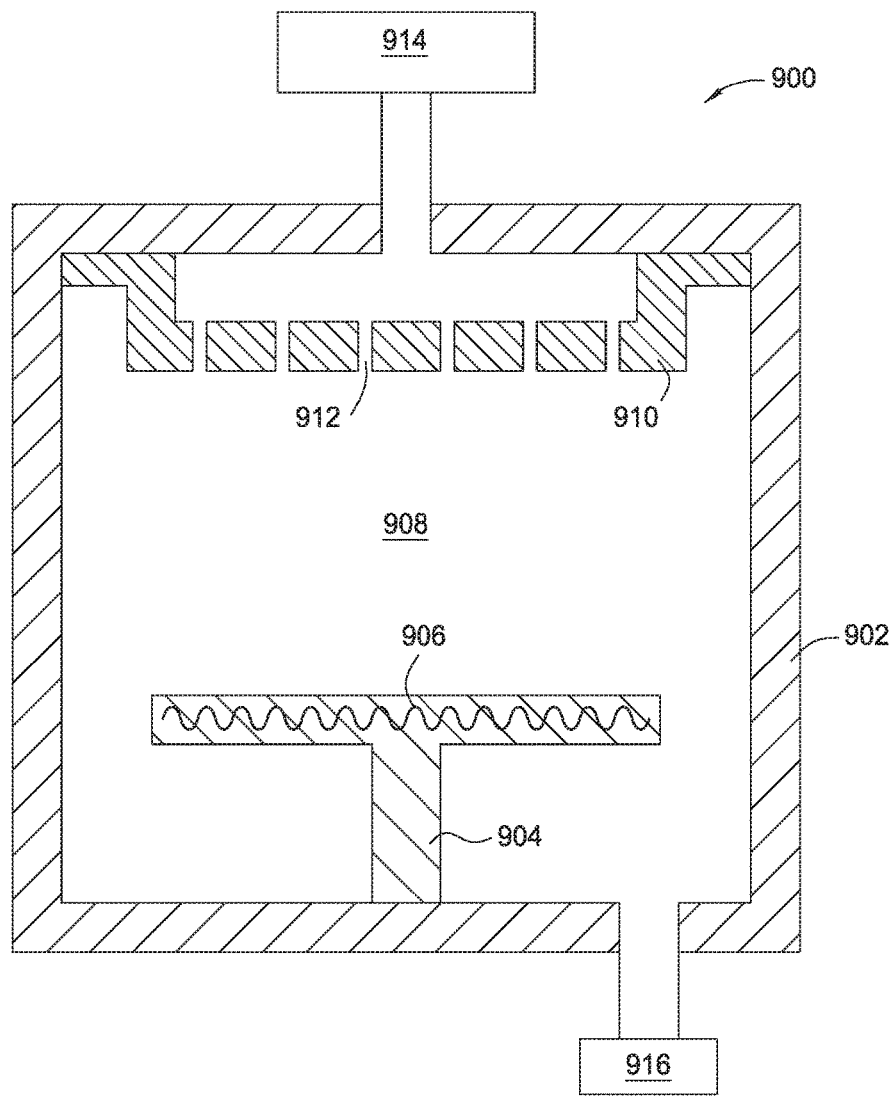
FIG. 9 illustrates a schematic, cross-sectional view of a passivation chamber according to embodiments described herein.

FIG. 9 illustrates a schematic, cross-sectional view of a passivation chamber 900 according to embodiments described herein. In one embodiment, the passivation chamber 900 may be the third processing chamber 190C. The passivation chamber 900 includes a chamber body 902, a pedestal 904, and a showerhead 910. The chamber body 902 may define a processing volume 908. The pedestal 904 and the showerhead 910 may be disposed opposite one another in the processing volume 908. The chamber body 902 may be manufactured from various materials configured for sub-atmospheric processing, such as stainless steel or aluminum. A vacuum pump 916 may be in fluid communication with the processing volume 908 to facilitate a sub-atmospheric pressure processing environment. Generally, the vacuum pump 916 may be configured to generate pressures within the processing volume 908 below about 100 Torr, such as between about 0 Torr and about 30 Torr. In certain embodiments, surfaces of the chamber body defining the processing volume 908 may be coated with one or more liner materials, such as ceramic materials or the like.

The pedestal 904 may be configured to support a substrate thereon during processing and a heater 906 may be embedded within the pedestal 904. Various edge rings or other substrate support apparatus (not shown) may be coupled to the pedestal 904 to further facilitate substrate support. In one embodiment, the heater 906 may be a resistive heater. Alternatively, the heater 906 may be a channel configured to circulate a heat transfer fluid therein. It is also contemplated that heaters may be disposed within sidewalls of the chamber body 902 to prevent undesirable deposition of materials thereon.

The showerhead 910 may be formed from various process compatible materials, such as aluminum, stainless steel, and ceramic materials, among others. A plurality of apertures 912 may be formed through the showerhead 910. The apertures 912 generally facilitate fluid communication between the processing volume 908 and a precursor source 914, or gas panel. The precursor source 914 may be adapted to provide one or more gas or liquid phase precursors to the processing volume 908 to facilitate substrate processing. In one embodiment, the precursor source 914 may be configured to provide chlorosilane materials, such as DCDMS. Alternatively, the precursor source 914 may be configured to provide silylamine materials, such as 1-(trimethylsilyl)pyrrolidine, aminosilane, or diaminosilane.

In operation, precursors from the precursor source 914 may be provided to the processing volume 908 via the apertures 912 of the showerhead 910. The heater 906 may heat the processing volume 908, or at least a region of the processing volume 908 immediately adjacent the substrate, to a temperature suitable to facilitate thermal dissociation of the precursors and enable reaction with surface modified dielectric materials disposed on the substrate being processed. In one embodiment, the heater 906 may be configured to provide a processing environment having a temperature of between about 20° C. and about 500° C. In other embodiments, the processing environment may have a temperature of less than about 400° C., such as about 200° C. Upon achieving suitable surface modification of the dielectric materials, such as methylation or alkyl silyl surface termination, undesirable reaction products may be evacuated from the processing volume 908 via the vacuum pump 916.

Alternatively or in addition to the embodiments described above, the passivation chamber 900 may be configured to perform a hydrogen plasma surface modification process. In this embodiment, the precursor source 914 may provide a hydrogen containing precursor and the showerhead 910 may be coupled to an RF power source (not shown). Accordingly, a hydrogen plasma may be formed and hydrogen ions and/or radicals may modify exposed surfaces of the substrate. In one embodiment, the hydrogen plasma may —H terminate exposed surfaces of epitaxially deposited source/drain materials. In addition, the hydrogen plasma may —OH terminate exposed silicon dioxide surfaces. Alternatively, the hydrogen plasma may —$NH_2$ terminate exposed silicon nitride surface.

In one embodiment, the hydrogen plasma surface modification process may be performed prior to performing the dielectric passivation process. In other words, the hydrogen plasma process may prepare exposed surfaces of dielectric materials disposed on the substrate for reaction with the chlorosilane and/or silylamine precursors. After performing the passivation process in the passivation chamber 900, dielectric materials disposed on the substrate may be alkylsilyl terminated and source/drain materials may remain —H terminated. Thus, subsequent selective deposition process may be enabled due to the compositional differences between dielectrics and source/drain materials.

Figure 10:
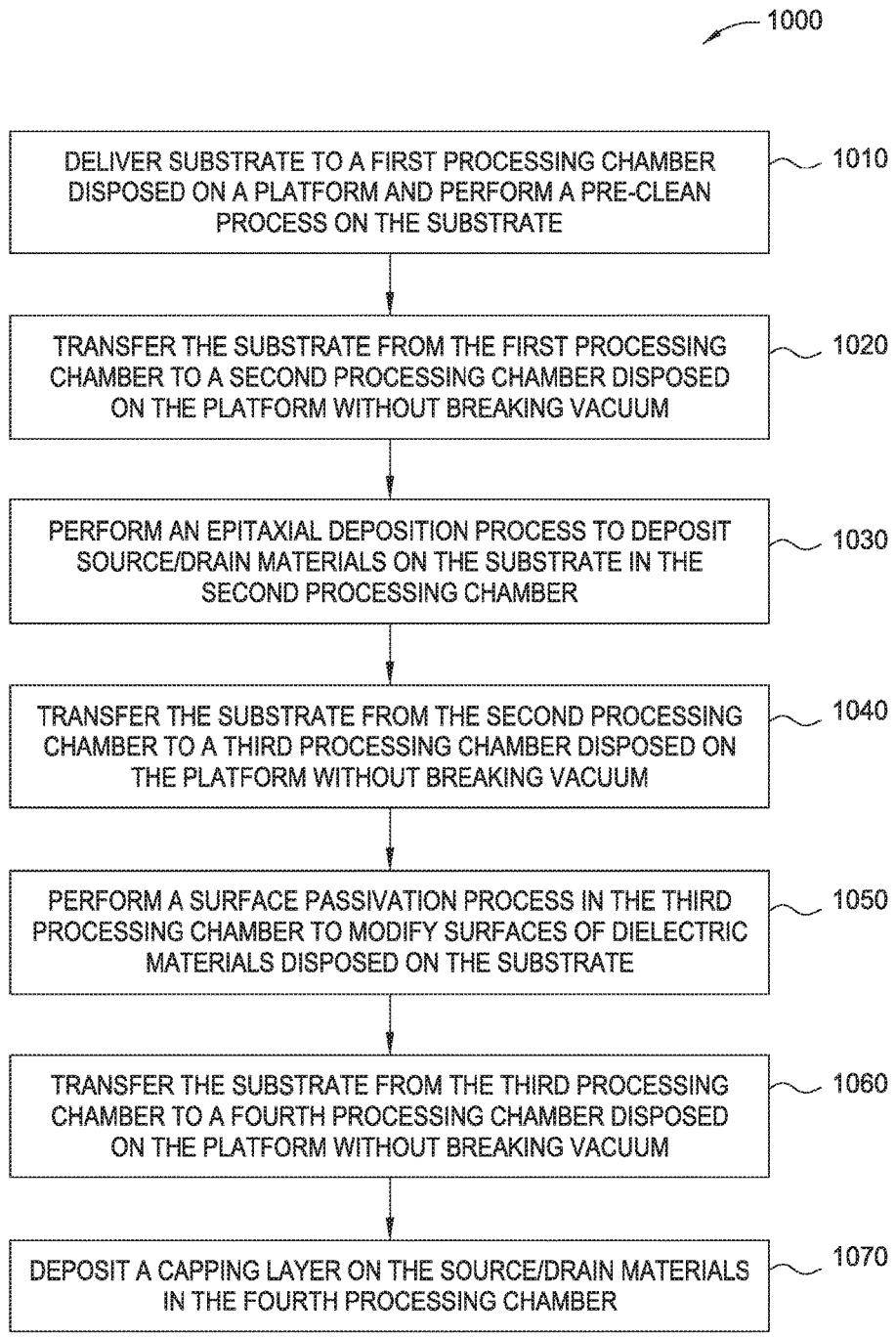
FIG. 10 illustrates operations of a method for processing a substrate utilizing a processing platform according to embodiments described herein.

FIG. 10 illustrates operations of a method 1000 for processing a substrate utilizing the processing platform 180 according to embodiments described herein. At operation 1010, the substrate may be delivered to the first processing chamber 190A disposed on the processing platform 180 and a pre-clean process, such as the SICONI® etch, may be performed on the substrate. In one embodiment, the pre-clean process may be optional. At operation 1020, the substrate may be transferred from the first processing chamber 190A to the second processing chamber 190B, via the transfer chamber 188 and robot 189, without breaking vacuum.

At operation 1030, an epitaxial deposition process may be performed to deposit source/drain materials on the substrate in the second processing chamber 190B. At operation 1040, the substrate may be transferred from the second processing chamber 190B to the third processing chamber 190C, via the transfer chamber 188 and robot 189, without breaking vacuum. At operation 1050, a surface passivation process may be performed on the substrate to modify surface of dielectric materials disposed on the substrate. In one embodiment, the surface passivation process may also include a hydrogen plasma dielectric materials modification process. In embodiments, including the hydrogen plasma surface modification, the surface modification may be performed prior to performing the surface passivation process.

At operation 1060, the substrate may be transferred from the third processing chamber 190C to the fourth processing chamber 190D, via the transfer chamber 188 and robot 189, without breaking vacuum. At operation 1070, a capping layer may be deposited on the source/drain materials in the fourth processing chamber 190D.

In summation, embodiments described herein provide for improved selective deposition methods and apparatus for performing the methods. Surface passivation of dielectric materials by alkyl silyl termination may provide for improved deposition selectivity of a capping layer on epitaxially deposited silicon containing materials. The capping layer may be resistant to common post-etching processes, such as fluorine containing plasmas, chlorine containing plasmas, bromine containing plasmas, and the like. Thus, excess epitaxially deposited materials may be unnecessary due to protection provided by the capping layer. The apparatus described herein may be utilized to efficiently implement the exemplary methods to improve throughput and ultimately reduce the cost associated with semiconductor device processing sequences.

While the foregoing is directed to embodiments of the present disclosure, other and further embodiments of the disclosure may be devised without departing from the basic scope thereof, and the scope thereof is determined by the claims that follow.

What is claimed is:

1. A substrate processing apparatus, comprising:
   a platform;
   a transfer chamber centrally disposed on the platform, wherein at least one robot is disposed within the transfer chamber;
   a pre-clean chamber disposed on the platform adjacent the transfer chamber;
   an epitaxial deposition chamber disposed on the platform adjacent the transfer chamber;
   a surface passivation chamber disposed on the platform adjacent the transfer chamber, the surface passivation chamber having a pedestal disposed therein, the pedestal including a resistive heater;
   an atomic layer deposition chamber disposed on the platform adjacent the transfer chamber; and
   a microprocessor controller programmed to:
      perform, in the pre-clean chamber, a pre-clean process on a substrate disposed in the pre-clean chamber;
      transfer, via the at least one robot, without breaking vacuum, the substrate from the pre-clean chamber to the epitaxial deposition chamber;
      perform, in the epitaxial deposition chamber, an epitaxial deposition process to deposit source/drain materials on the substrate;
      transfer, via the at least one robot, without breaking vacuum, the substrate from the epitaxial deposition chamber to the surface passivation chamber;
      perform, in the surface passivation chamber, a surface passivation process to deposit an alkyl silyl material on dielectric materials disposed on the substrate;
      transfer, via the at least one robot, without breaking vacuum, the substrate from the surface passivation chamber to the atomic layer deposition chamber; and
      perform, in the atomic layer deposition chamber, a deposition operation to form a capping layer on the source/drain materials.

2. The apparatus of claim 1, wherein the transfer chamber, the pre-clean chamber, the epitaxial deposition chamber, the surface passivation chamber, and the atomic layer deposition chamber are maintained at sub-atmospheric pressure.

3. The apparatus of claim 1, wherein the surface passivation chamber further comprises:
   a chamber body defining a process volume; and
   a showerhead disposed in the process volume opposite the pedestal, wherein the showerhead has apertures formed therein for delivering a chlorosilane material or a silylamine material to the process volume.

4. The apparatus of claim 3, wherein the chlorosilane material is dichlorodimethylsilane.

5. The apparatus of claim 3, wherein the silylamine material is selected from the group consisting of 1-(trimethylsilyl)pyrrolidine, aminosilane, diaminosilane, and combinations thereof.

6. The apparatus of claim 1, wherein the surface passivation chamber further comprises:
   a heater disposed within sidewalls of the chamber body.

7. The apparatus of claim 6, wherein the resistive heater disposed in the pedestal, the heater disposed within sidewalls of the chamber body, or a combination thereof is operable to maintain the process volume at a temperature of between about 20° C. and about 500° C.

8. The apparatus of claim 1, wherein the surface passivation chamber further comprises:
   a chamber body defining a process volume; and
   a showerhead disposed in the process volume opposite the pedestal, the showerhead coupled to an RF power source, wherein the microprocessor controller is further programmed to deliver hydrogen ions and/or radicals to the process volume via a plurality of apertures in the showerhead.

9. The apparatus of claim 1, wherein the pre-clean chamber comprises:
   a chamber body defining a process region;
   a support assembly disposed within the process region; and
   a lid assembly disposed opposite the support assembly, wherein the lid assembly defines one or more remote plasma regions therein.

10. The apparatus of claim 9, wherein the lid assembly further comprises:
    a gas delivery plate disposed adjacent the process region;
    a top plate comprising an electrode disposed opposite the gas delivery plate; and
    a blocker assembly comprising a plurality of blocker plates disposed between the gas delivery plate and the top plate.

11. The apparatus of claim 10, wherein a first remote plasma region of the one or more remote plasma regions is defined between the top plate and a first blocker plate of the blocker assembly.

12. The apparatus of claim 11, wherein a second remote plasma region of the one or more remote plasma regions is defined between the first blocker plate and a second blocker plate of the blocker assembly.

13. The apparatus of claim 12, wherein a third remote plasma region of the one or more remote plasma regions is defined between the second blocker plate and the gas delivery plate.

* * * * *

UNITED STATES PATENT AND TRADEMARK OFFICE
CERTIFICATE OF CORRECTION

PATENT NO. : 10,199,215 B2
APPLICATION NO. : 15/684827
DATED : February 5, 2019
INVENTOR(S) : Abhishek Dube et al.

It is certified that error appears in the above-identified patent and that said Letters Patent is hereby corrected as shown below:

In the Drawings

On sheet 1 of 7, in Figure 1, reference numeral 110, Line 1, delete "OPTI0NAL" and insert -- OPTIONAL --, therefor.

In the Specification

In Column 4, Line 43, delete "hexafluorisilicate" and insert -- hexafluorosilicate --, therefor.

In Column 11, Line 52, delete "$NH_3$and" and insert -- $NH_3$ and --, therefor.

In Column 11, Line 52, delete "$NH_3$and" and insert -- $NH_3$ and --, therefor.

In Column 12, Line 6, delete "$(NH_4)_2SiF_6$on" and insert -- $(NH_4)_2SiF_6$ on --, therefor.

In Column 12, Line 7, delete "$NH_3$and" and insert -- $NH_3$ and --, therefor.

Signed and Sealed this
Twenty-sixth Day of March, 2019

Andrei Iancu
*Director of the United States Patent and Trademark Office*